(12) United States Patent
Badehi

(10) Patent No.: US 6,624,505 B2
(45) Date of Patent: Sep. 23, 2003

(54) PACKAGED INTEGRATED CIRCUITS AND METHODS OF PRODUCING THEREOF

(75) Inventor: Avner Badehi, Yehuda (IL)

(73) Assignee: Shellcase, Ltd., Jerusalem (IL)

( * ) Notice: Subject to any disclaimer, the term of this patent is extended or adjusted under 35 U.S.C. 154(b) by 36 days.

(21) Appl. No.: 09/758,906

(22) Filed: Jan. 11, 2001

(65) Prior Publication Data

US 2003/0080398 A1 May 1, 2003

Related U.S. Application Data

(63) Continuation-in-part of application No. 09/601,895, filed on Sep. 22, 2000.

(30) Foreign Application Priority Data

Feb. 6, 1998 (IL) .................................................. 123207
Feb. 3, 1999 (WO) ................................. PCT/IL00/00071

(51) Int. Cl.⁷ .............................................. H01L 23/02
(52) U.S. Cl. ...................... 257/678; 257/787; 257/627; 438/106
(58) Field of Search ................................. 437/214, 678; 257/787, 678, 621, 698, 627, 82; 438/106, 107; 428/699

(56) References Cited

U.S. PATENT DOCUMENTS

| | | |
|---|---|---|
| 4,551,629 A | 11/1985 | Carson et al. |
| 4,764,846 A | 8/1988 | Go |
| 4,794,092 A | 12/1988 | Solomon |
| 4,862,249 A | 8/1989 | Carlson |
| 4,984,358 A | 1/1991 | Nelson |
| 5,104,820 A | 4/1992 | Go, deceased et al. |
| 5,126,286 A | 6/1992 | Chance |
| 5,266,833 A | 11/1993 | Capps |
| 5,500,540 A  * | 3/1996 | Jewell et al. .................. 257/82 |

(List continued on next page.)

FOREIGN PATENT DOCUMENTS

| | | |
|---|---|---|
| EP | 490739 | 6/1992 |
| JP | 63-166710 | 6/1988 |
| WO | WO 85/02283 | 5/1985 |
| WO | WO 89/04113 | 5/1989 |
| WO | WO 95/19645 | 7/1995 |

OTHER PUBLICATIONS

"Three Dimensional Hybrid Wafer Scale Integration Using the GE High Density Interconnect Technology", by R.J. Wojnarowski, et al., of General Electric Company, Corporate Research & Development, USA, International Conference on Wafer Scale Integration, 1993.

"M–DENSUS", Dense–Pac Microsystems, Inc., Semiconductor International, Dec. 1997, p. 50.

(List continued on next page.)

*Primary Examiner*—Hoai Ho
*Assistant Examiner*—Thinh T Nguyen
(74) *Attorney, Agent, or Firm*—Edwards & Angell, LLP; John J. Penny, Jr.; David G. Conlin

(57) ABSTRACT

This invention discloses a packaged integrated circuit including an integrated circuit substrate lying in a substrate plane and having electrical circuitry formed thereon, a package enclosing the integrated circuit substrate and defining first and second planar surfaces generally parallel to the substrate plane and a plurality of electrical contacts, each connected to the electrical circuitry at the substrate plane, at least some of the plurality of electrical contacts extending onto the first planar surface and at least some of the plurality of electrical contacts extending onto the second planar surface.

A method for producing packaged integrated circuits is also disclosed.

38 Claims, 12 Drawing Sheets

U.S. PATENT DOCUMENTS

| | | |
|---|---|---|
| 5,546,654 A | 8/1996 | Wojnarowski et al. |
| 5,567,657 A * | 10/1996 | Wojnarowski et al. ...... 437/214 |
| 5,612,570 A | 3/1997 | Eide et al. |
| 5,657,206 A | 8/1997 | Pedersen et al. |
| 5,661,087 A | 8/1997 | Pedersen et al. |
| 5,675,180 A | 10/1997 | Pedersen et al. |
| 5,703,400 A | 12/1997 | Wojnarowski et al. |
| 5,814,894 A * | 9/1998 | Igarashi et al. ............. 257/787 |
| 5,817,541 A * | 10/1998 | Averkiou et al. ........... 438/107 |
| 5,837,566 A | 11/1998 | Pedersen et al. |
| 5,849,623 A | 12/1998 | Wojnarowski et al. |
| 5,857,858 A | 1/1999 | Gorowitz et al. |
| 5,859,475 A | 1/1999 | Freyman et al. |
| 5,869,353 A | 2/1999 | Levy et al. |
| 5,888,884 A | 3/1999 | Wojnarowski |
| 5,891,761 A | 4/1999 | Vindasius et al. |
| 5,900,674 A | 5/1999 | Wojnarowski et al. |
| 5,909,052 A * | 6/1999 | Ohta et al. .................. 257/627 |
| 5,938,452 A | 8/1999 | Wojnarowski |
| 5,952,712 A * | 9/1999 | Ikuina et al. ............... 257/678 |
| 5,965,933 A * | 10/1999 | Young et al. ............... 257/621 |
| 5,985,695 A | 11/1999 | Freyman et al. |
| 5,993,981 A * | 11/1999 | Askinazi et al. ............ 428/699 |
| 6,002,163 A | 12/1999 | Wojnarowski |
| 6,020,217 A * | 2/2000 | Kuisi et al. ................. 438/106 |
| 6,046,410 A | 4/2000 | Wojnarowski et al. |
| 6,072,236 A * | 6/2000 | Akram et al. ............... 257/698 |
| 6,080,596 A | 6/2000 | Vintasius et al. |
| 6,092,280 A | 7/2000 | Wojnarowski |
| 6,098,278 A | 8/2000 | Vindasius et al. |
| 6,124,637 A | 9/2000 | Freyman et al. |
| 6,134,118 A | 10/2000 | Pedersen et al. |

OTHER PUBLICATIONS

"Introduction to Cubic Memory, Inc.", Cubic Memory Incorporated, 27 Janis Way, Scotts Valley, CA. 95066, USA.

"Memory Modules Increase Density", DensPac Microsystems, Garden Grove, CA, USA, Electronics Packaging and Production, p. 24, Nov. 1994.

"Four Semiconductor Manufactures Agree to Unified Specifications for Stacked Chip Scale Packages", Mitsubishi Semiconductors, Mitsubishi Electronics America, Inc., 1050 East Arques Avenue, Sunnyvale, CA, USA.

"High Density Packaging: The Next Interconnect Challenge", Semiconductor International, Feb. 2000, pp. 91–100.

"Front–End 3–D Packaging", J. Baliga, Semiconductor International, Dec. 1999, p. 52.

"3–D IC Packaging", Semiconductor International, p. 20, May 1998.

"First Three–Chip Staked CSP Developed", Semiconductor International, Jan. 2000, p. 22.

"High Density Pixel Detector Module Using Flip Chip and Thin Film Technology" JI. Wolf, P. Gerlach, E. Beyne, M. Topper, L. Dietrich, K.H. Becks, N. Wermes, O. Ehrmann and H. Reichl, International System Packaging Symposium, Jan. 1999, San Diego.

A. Fan, A. Rahman and R. Reif. "Copper Wafer Bonding", Electrochemical and Solid–State Letters 2(10) 534–536 (1999).

* cited by examiner

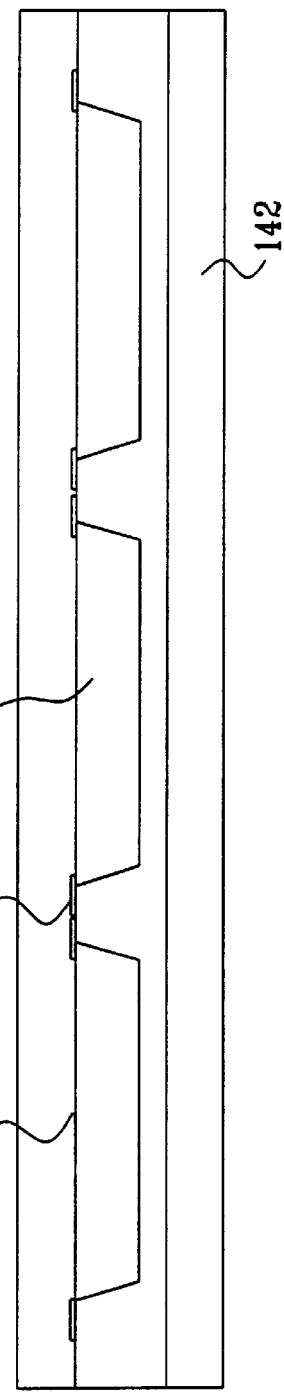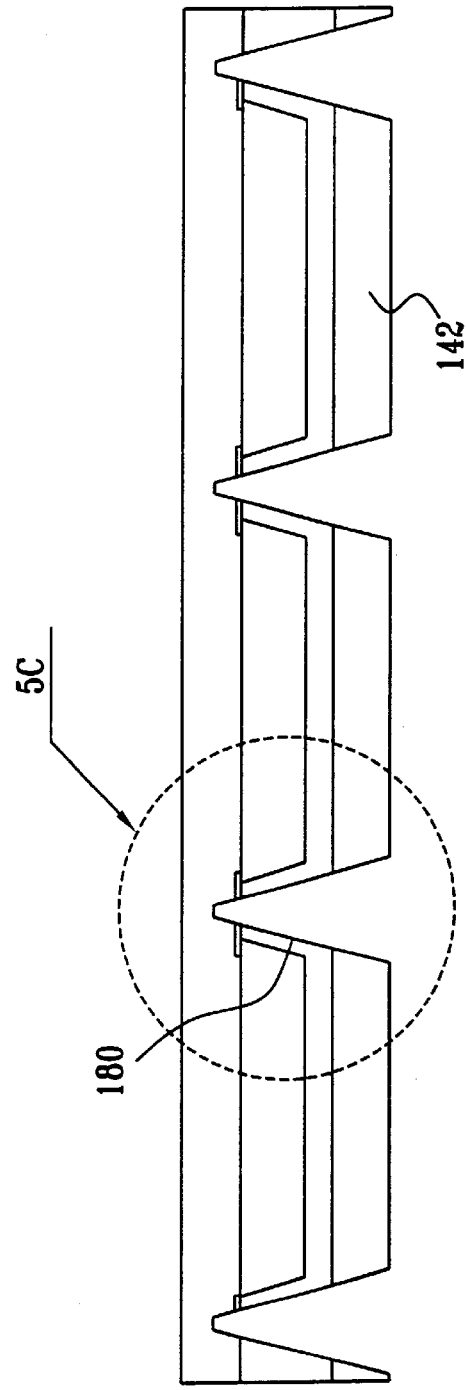
FIG. 5A
FIG. 5B

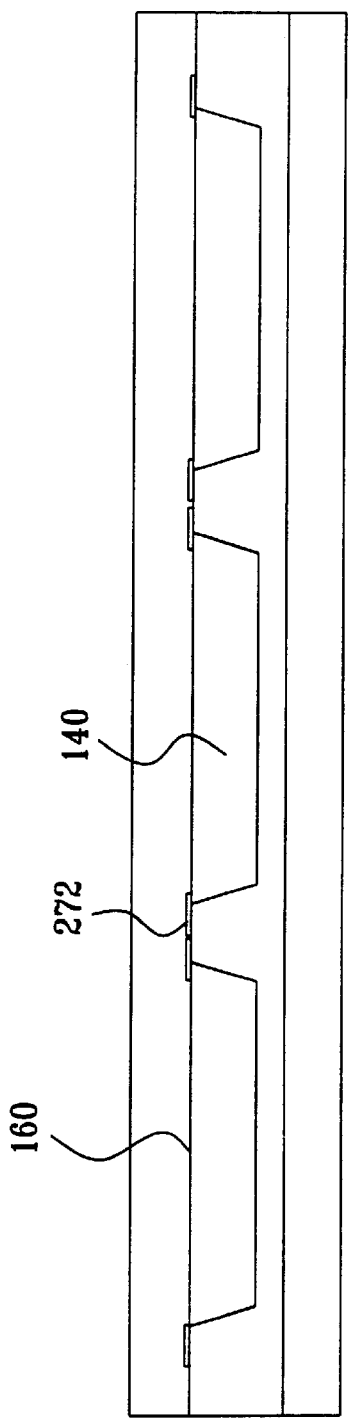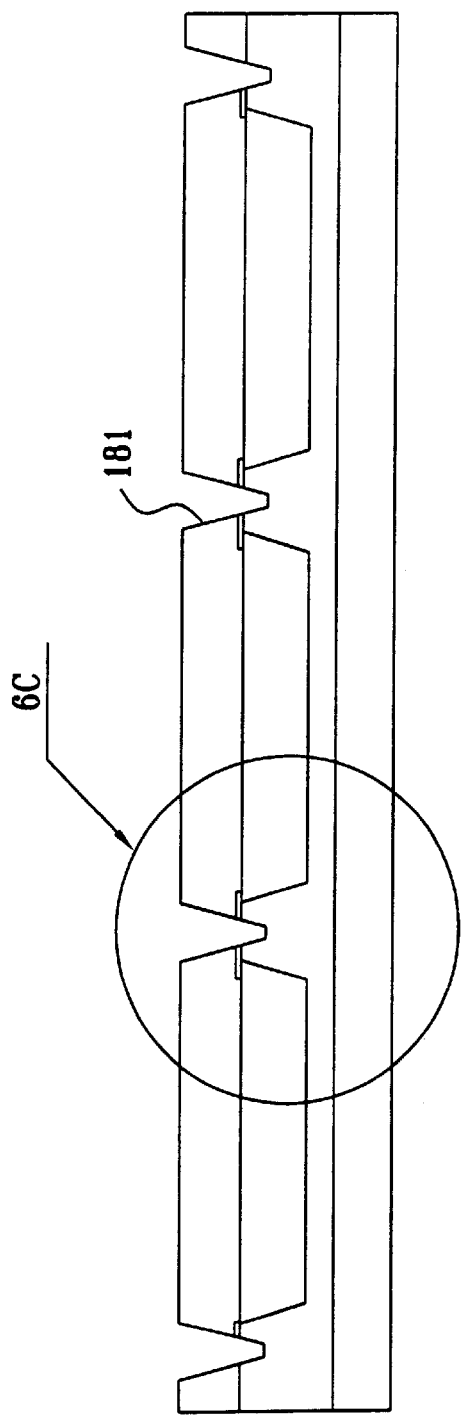
FIG. 6A
FIG. 6B

PACKAGED INTEGRATED CIRCUITS AND METHODS OF PRODUCING THEREOF

REFERENCE TO RELATED APPLICATIONS

This application is a continuation-in-part of assignee's pending application U.S. patent application Ser. No. 09/601,895, filed Sep. 22, 2000 and entitled "Integrated Circuit Device".

FIELD OF THE INVENTION

The present invention relates to integrated packaging, packaged integrated circuits and methods of producing packaged integrated circuits.

BACKGROUND OF THE INVENTION

Various types of packaged integrated circuits are known in the prior art. The following patents and published patent applications of the present inventor and the references cited therein are believed to represent the state of the art:

U.S. Pat. Nos. 4,551,629; 4,764,846; 4,794,092; 4,862,249; 4,984,358; 5,104,820; 5,126,286; 5,266,833; 5,546,654; 5,567,657; 5,612,570; 5,657,206; 5,661,087; 5,675,180; 5,703,400; 5,837,566; 5,849,623; 5,857,858; 5,859,475; 5,869,353; 5,888,884; 5,891,761; 5,900,674; 5,938,45; 5,985,695; 6,002,163; 6,046,410; 6,080,596; 6,092,280; 6,098,278; 6,124,637; 6,134,118.

EP 490739 A1; JP 63-166710

WO 85/02283; WO 89/04113; WO 95/19645

The disclosures in the following publications:

"Three Dimensional Hybrid Wafer Scale Integration Using the GE High Density Interconnect Technology" by R. J. Wojnarowski, R. A Filliion, B. Gorowitz and R. Saia of General Electric Company, Corporate Research & Development, P.O. Box 8, Schenectady, N.Y. 12301, USA, International Conference on Wafer Scale Integration, 1993.

"M-DENSUS", Dense-Pac Microsystems, Inc., Semiconductor International, December 1997, p. 50;

"Introduction to Cubic Memory, Inc." Cubic Memory Incorporated, 27 Janis Way, Scotts Valley, Calif. 95066, USA;

"A Highly Integrated Memory Subsystem for the Smaller Wireless Devices" Intel(r) Stacked-CSP, Intel Corporation, January 2000;

"Product Construction Analysis (Stack CSP)", Sung-Fei Wang, ASE, R & D Group, Taiwan, 1999;

"Four Semiconductor Manufacturers Agree to Unified Specifications for Stacked Chip Scale Packages", Mitsubishi Semiconductors, Mitsubishi Electronics America, Inc., 1050 East Arques Avenue, Sunnyvale, Calif. 94086, USA;

"Assembly & Packaging, John Baliga, Technology News, Semiconductor International, December 1999;

"<6 mils Wafer Thickness Solution (DBG Technology)", Sung-Fei Wang, ASE, R & D Group, Taiwan, 1999;

"Memory Modules Increase Density", DensePac MicroSystems, Garden Grove, Calif., USA, Electronics Packaging and Production, p. 24, November 1994;

"First Three-Chip Staked CSP Developed", Semiconductor International, January 2000, p. 22;

"High-Density Packaging: The Next Interconnect Challenge", Semiconductor International, February 2000, pp. 91–100;

"3-D IC Packaging", Semiconductor International, p. 20, May 1998;

"High Density Pixel Detector Module Using Flip Chip and Thin Film Technology" J. Wolf, P. Gerlach, E. Beyne, M. Topper, L. Dietrich, K. H. Becks, N. Wermes, O. Ehrmann and H. Reichl, International System Packaging Symposium, January 1999, San Diego;

"Copper Wafer Bonding", A. Fan, A. Rahman and R. Rief, Electrochemical and Solid State Letters, 2(10), pp. 534–536, 1999;

"Front-End 3-D Packaging", J. Baliga, Semiconductor International, December 1999, p 52, are also believed to represent the state of the art.

SUMMARY OF THE INVENTION

The present invention seeks to provide improved packaged integrated circuits and methods for producing same.

There is thus provided in accordance with a preferred embodiment of the present invention a packaged integrated circuit including an integrated circuit substrate lying in a substrate plane and having electrical circuitry formed thereon, a package enclosing the integrated circuit substrate and defining first and second planar surfaces generally parallel to the substrate plane and a plurality of electrical contacts, each connected to the electrical circuitry at the substrate plane, at least some of the plurality of electrical contacts extending onto the first planar surface and at least some of the plurality of electrical contacts extending onto the second planar surface.

Further in accordance with a preferred embodiment of the present invention the package is a chip-scale package.

Additionally in accordance with a preferred embodiment of the present invention the package includes at least one portion which is at least partially transparent to visible radiation. Alternatively the package includes at least one portion which is partially transparent to infra-red radiation.

There is also provided in accordance with another preferred embodiment of the present invention a packaged integrated circuit assembly including a packaged integrated circuit including an integrated circuit substrate lying in a substrate plane and having electrical circuitry formed thereon, a package enclosing the integrated circuit substrate and defining first and second planar surfaces generally parallel to the substrate plane and a plurality of electrical contacts, each connected to the electrical circuitry at least some of the plurality of electrical contacts extending onto the first planar surface and at least some of the plurality of electrical contacts extending onto the second planar surface and at least one additional electrical circuit element mounted onto and supported by the second planar surface and electrically coupled to at least one of the plurality of electrical contacts extending therealong.

Further in accordance with a preferred embodiment of the present invention the additional electrical circuit element includes an electrical component selected from the group consisting of: passive electrical elements, light generating elements, heat generating elements, light detecting elements, integrated circuits, hybrid circuits, environmental sensors, radiation sensors, micromechanical sensors, mechanical actuators and force sensors.

Additionally in accordance with a preferred embodiment of the present invention the package includes at least one portion which is at least partially transparent to visible radiation. Alternatively the package includes at least one portion which is at least partially transparent to infra-red radiation.

Still further in accordance with a preferred embodiment of the present invention the package is a chip-scale package.

There is further provided in accordance with a preferred embodiment of the present invention a method for producing packaged integrated circuits. The method includes producing, on a wafer scale, an integrated circuit substrate lying in a substrate plane and having electrical circuitry formed thereon, providing wafer scale packaging enclosing the integrated circuit substrate and defining first and second planar surfaces generally parallel to the substrate plane, forming on the wafer scale packaging a plurality of electrical contacts, each connected to the electrical circuitry at the substrate plane, at least some of the plurality of electrical contacts extending onto the first planar surface and at least some of the plurality of electrical contacts extending onto the second planar surface and separating the integrated circuit substrate in the wafer scale packaging into a plurality of individual chip packages.

Further in accordance with a preferred embodiment of the present invention the plurality of individual chip packages are chip scale packages.

Additionally in accordance with a preferred embodiment of the present invention the package includes at least one portion which is at least partially transparent to visible radiation. Alternatively the package includes at least one portion which is at least partially transparent to infra-red radiation.

There is also provided in accordance with yet another preferred embodiment of the present invention a method for producing packaged integrated circuit assemblies. The method includes producing, on a wafer scale, an integrated circuit substrate lying in a substrate plane and having electrical circuitry formed thereon, providing wafer scale packaging enclosing the integrated circuit substrate and defining first and second planar surfaces generally parallel to the substrate plane, forming on the wafer scale packaging a plurality of electrical contacts, each connected to the electrical circuitry, at least some of the plurality of electrical contacts extending onto the first planar surface and at least some of the plurality of electrical contacts extending onto the second planar surface, separating the integrated circuit substrate in the wafer scale packaging into a plurality of individual chip packages and mounting onto the at second planar surface of at least one of the plurality of individual chip packages, at least one additional electrical circuit element, the at least one additional electrical circuit element being supported by the second planar surface and electrically coupled to at least one of the plurality of electrical contacts extending therealong.

Further in accordance with a preferred embodiment of the present invention the additional electrical circuit element includes an electrical component selected from the group consisting of passive electrical elements, light generating elements, heat generating elements, light detecting elements, integrated circuits, hybrid circuits, environmental sensors, radiation sensors, micromechanical sensors, mechanical actuators and force sensors.

Additionally in accordance with a preferred embodiment of the present invention the package includes at least one portion which is at least partially transparent to visible radiation. Alternatively the package includes at least one portion which is at least partially transparent to infra-red radiation.

There is further provided in accordance with yet another preferred embodiment of the present invention a method for producing packaged integrated circuit assemblies. The method includes producing, on a wafer scale, an integrated circuit substrate lying in a substrate plane and having electrical circuitry formed thereon, providing wafer scale packaging enclosing the integrated circuit substrate and defining first and second planar surfaces generally parallel to the substrate plane, forming on the wafer scale packaging a plurality of electrical contacts, each connected to the electrical circuitry, at least some of the plurality of electrical contacts extending onto the first planar surface and at least some of the plurality of electrical contacts extending onto the second planar surface, mounting onto the at second planar surface of the wafer scale packaging, at least one additional electrical circuit element, the at least one additional electrical circuit element being supported by the second planar surface and electrically coupled to at least one-of the plurality of electrical contacts extending therealong and separating the integrated circuit substrate in the wafer scale packaging into a plurality of individual chip packages.

Further in accordance with a preferred embodiment of the present invention the additional electrical circuit element includes an electrical component selected from the group consisting of: passive electrical elements, light generating elements, heat generating elements, light detecting elements, integrated circuits, hybrid circuits, environmental sensors, radiation sensors, micromechanical sensors, mechanical actuators and force sensors.

Additionally in accordance with a preferred embodiment of the present invention the package includes at least one portion which is at least partially transparent to visible radiation. Alternatively the package includes at least one portion which is at least partially transparent to infra-red radiation.

BRIEF DESCRIPTION OF THE DRAWINGS

The present invention will be understood and appreciated more fully from the following detailed description, taken in conjunction with the drawings in which:

FIGS. 5A, 5B, 5C, 5D and 5E are simplified sectional illustrations taken along lines VI—VI in FIG. 4A of a second series of stages in the production of chip-scale packaged integrated circuits in accordance with a preferred embodiment of the present invention;

FIGS. 6A, 6B, 6C, 6D and 6E are simplified sectional illustrations taken along lines V—V in FIG. 4B of the second series of stages in the production of chip-scale packaged integrated circuits in accordance with a preferred embodiment of the present invention.

DETAILED DESCRIPTION OF PREFERRED EMBODIMENTS

Figure 1:
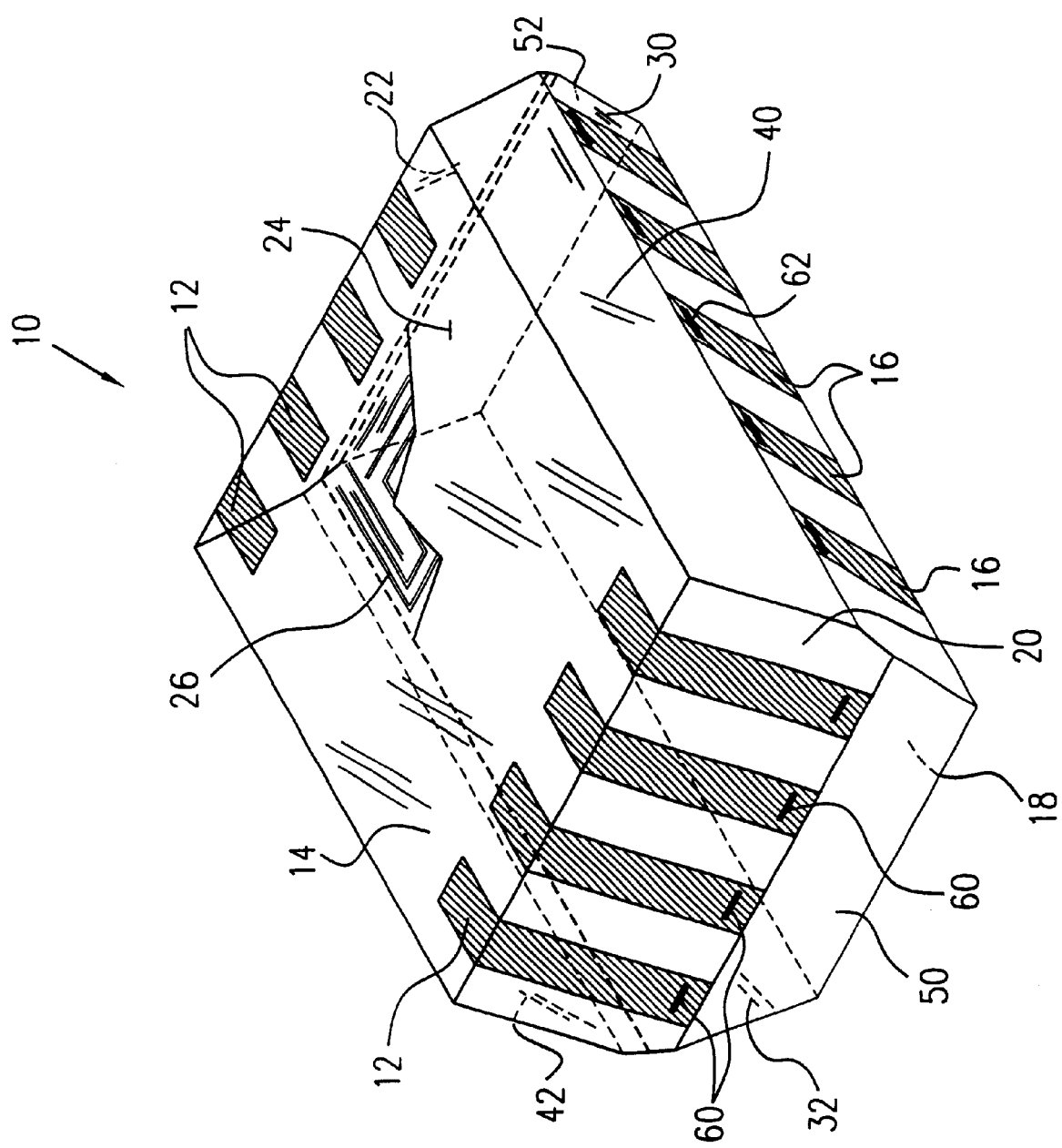
FIG. 1 is a simplified pictorial illustration of a chip-scale packaged integrated circuit constructed and operative in accordance with a preferred embodiment of the present invention.

Reference is now made to FIG. 1, which is a simplified pictorial illustration of a chip-scale packaged integrated circuit constructed and operative in accordance with a preferred embodiment of the present invention. FIG. 1 illustrates a preferred embodiment of integrated circuit device constructed and operative in accordance with a preferred embodiment of the present invention and includes a relatively thin and compact, environmentally protected and mechanically strengthened packaged integrated circuit 10, having a multiplicity of electrical contacts plated along edge surfaces and planar surfaces thereof.

In contrast with prior art devices, such as those described in applicant's published PCT application WO 95/19645, the packaged integrated circuit shown in FIG. 1 is characterized in that it has electrical contacts 12 extending along a first planar surface 14 thereof and also has electrical contacts 16 extending along an oppositely facing second planar surface 18 thereof. This arrangement enables the packaged integrated circuit to be conveniently mounted in a stacked arrangement.

As seen in FIG. 1, the packaged integrated circuit 10 includes a plurality of generally planar edge surfaces which extend non-perpendicularly with respect to planar surfaces 14 and 18. These edge surfaces include first and second edge surfaces 20 and 22, each of which intersects the plane of a silicon substrate 24 on which is formed an integrated circuit 26 and extends from a location slightly beyond that plane to planar surface 14.

There are also provided third and fourth edge surfaces 30 and 32, each of which intersects the plane of silicon substrate 24 and extends from a location slightly beyond that plane to planar surface 18. There are also provided fifth and sixth edge surfaces 40 and 42, neither of which intersects the plane of silicon substrate 24. Each of edge surfaces 40 and 42 intersects a respective one of surfaces 30 and 32 and extends therefrom to planar surface 14. There are additionally provided seventh and eighth edge surfaces 50 and 52, neither of which intersects the plane of silicon substrate 24. Each of edge surfaces 50 and 52 intersects a respective one of surfaces 20 and 22 and extends therefrom to planar surface 18.

It is seen that contacts 12 extend along respective edge surfaces 20 and 22 and onto planar surface 14 and are in electrical contact with edges of pads 60 extending from silicon substrate 24 in the plane thereof. It is also seen that contacts 16 extend along respective edge surfaces 30 and 32 and onto planar surface 18 and are in electrical contact with edges of pads 62 extending from silicon substrate 24 in the plane thereof.

Figure 2A:
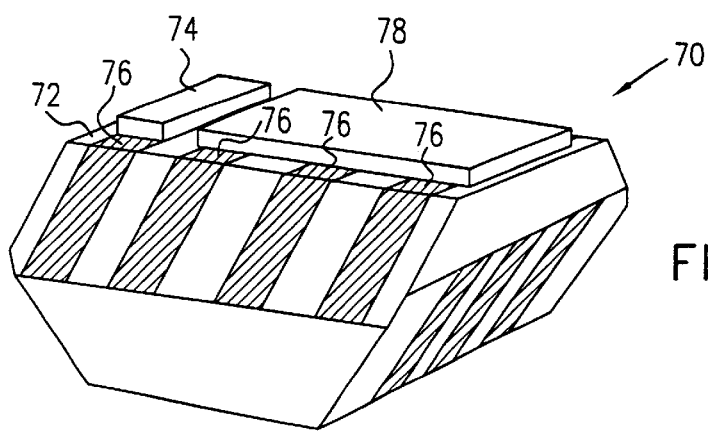
FIGS. 2A, 2B and 2C are simplified pictorial illustrations of three examples of packaged integrated circuit assemblies constructed and operative in accordance with a preferred embodiment of the present invention.
Figure 2B:
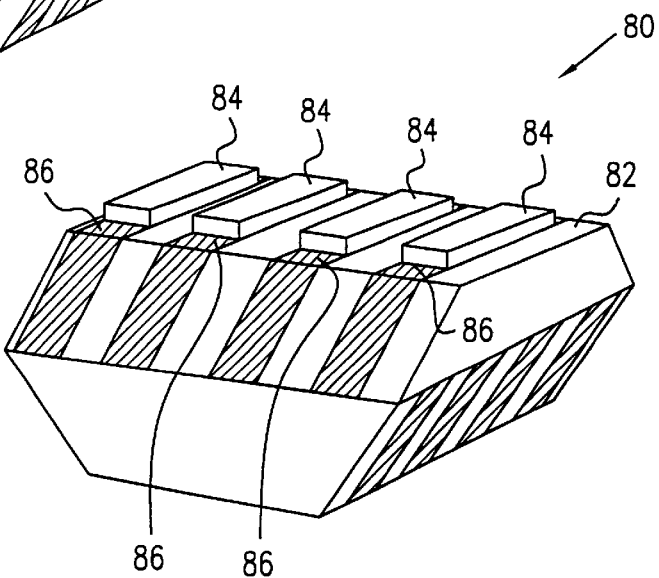
Figure 2C:
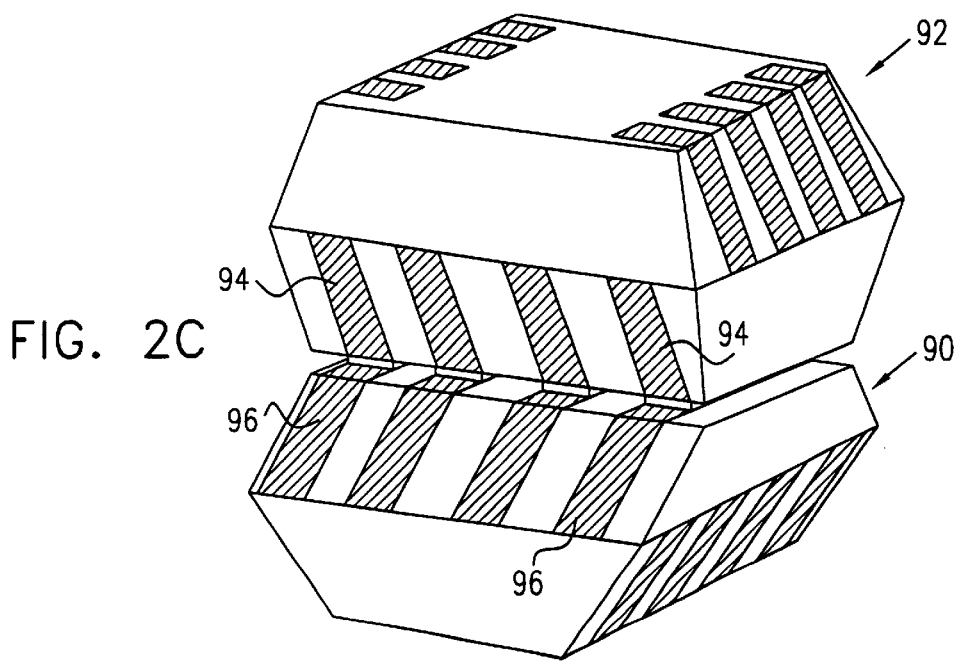

Reference is now made to FIGS. 2A, 2B and 2C, which are simplified pictorial illustrations of three examples of packaged integrated circuit assemblies constructed and operative in accordance with a preferred embodiment of the present invention.

FIG. 2A illustrates a packaged integrated circuit 70 having mounted onto a planar surface 72 thereof, a plurality of other electrical devices, such as integrated circuits 78 and 74. It is seen that, for example, integrated circuit 74 electrically engages a pair of contacts 76 formed on planar surface 72, while integrated circuit 78 electrically engages six contacts 76 formed on planar surface 72.

FIG. 2B illustrates a packaged integrated circuit 80 having mounted onto a planar surface 82 thereof, a plurality of other electrical devices, such as four integrated circuits 84. It is seen that, for example, integrated circuits 84 each electrically engage a pair of contacts 86 formed on planar surface 82.

FIG. 2C illustrates a pair of packaged integrated circuits 90 and 92 mounted in a stacked arrangement, wherein contacts 94 of integrated circuit 92 are in electrical contact with corresponding contacts 96 of integrated circuit 90. It is appreciated that stacks having more than two integrated circuits of this type may be provided and that the integrated circuits need not be stacked in registration with each other, thus providing branched stacks.

Reference is now made to FIGS. 3A, 3B, 3C, 3D, 3E and 3F, which are simplified pictorial and sectional illustrations of a first series of stages in the production of chip-scale packaged integrated circuits in accordance with a preferred embodiment of the present invention.

Figure 3A:
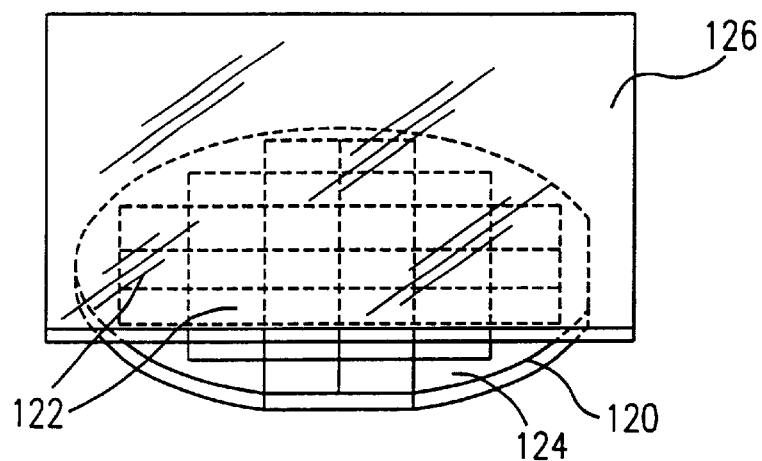
FIGS. 3A and 3B are simplified illustrations of a first series of stages in the production of chip-scale packaged integrated circuits in accordance with a preferred embodiment of the present invention.
Figure 3B:
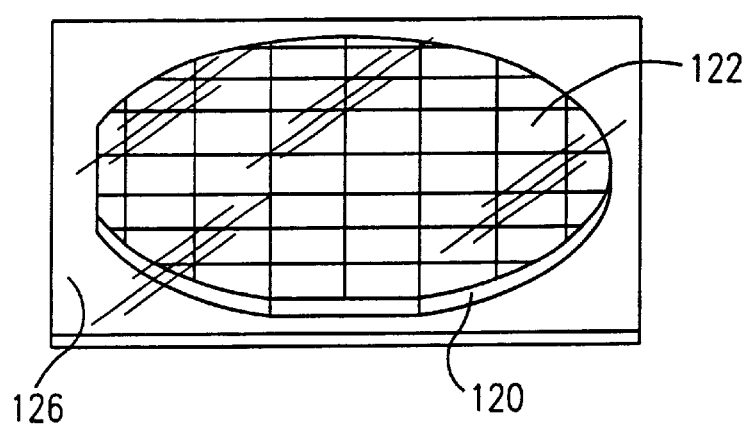
Figure 3C:
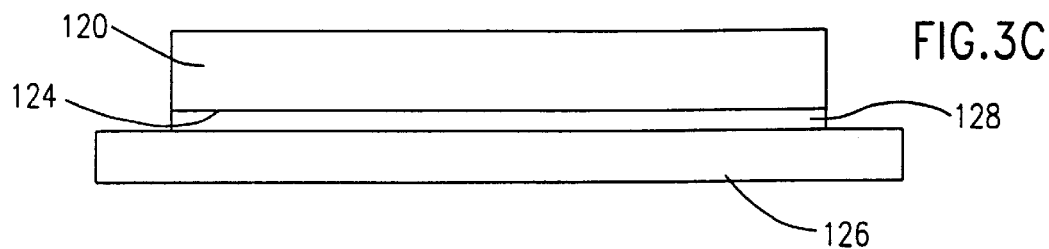
FIGS. 3C, 3D, 3E and 3F, are simplified sectional illustrations of a first series of stages in the production of chip-scale packaged integrated circuits in accordance with a preferred embodiment of the present invention.

In accordance with a preferred embodiment of the present invention, and as illustrated in FIGS. 3A, 3B and 3C a complete silicon wafer 120 having a plurality of finished dies 122 formed thereon by conventional techniques, is bonded at its active surface 124 to a protective insulating cover plate 126 via a layer 128 of epoxy. The insulating cover plate 126 typically comprises glass, quartz, sapphire or any other suitable insulative substrate. FIG. 3A illustrates the initial mutual arrangement of cover plate 126 and wafer 120, FIG. 3B illustrates the final placement and FIG. 3C shows the bonding in a sectional illustration.

The cover plate 126 may be opaque or transparent or may be colored or tinted in order to operate as a spectral filter. Alternatively, a dichroic or colored spectral filter may be formed on at least one surface of the cover plate 126.

It is appreciated that certain steps in the conventional fabrication of silicon wafer 120 may be eliminated when the wafer is used in accordance with the present invention. These steps include the provision of via openings above pads, wafer back grinding and wafer back metal coating.

The complete silicon wafer 120 may be formed with an integral color filter array by conventional lithography techniques at any suitable location therein. Prior to the bonding step of FIGS. 3A, 3B & 3C, a filter may be formed and configured by conventional techniques over the cover plate 126, such that the filter plane lies between cover plate 126 and the epoxy layer 128.

Figure 3D:
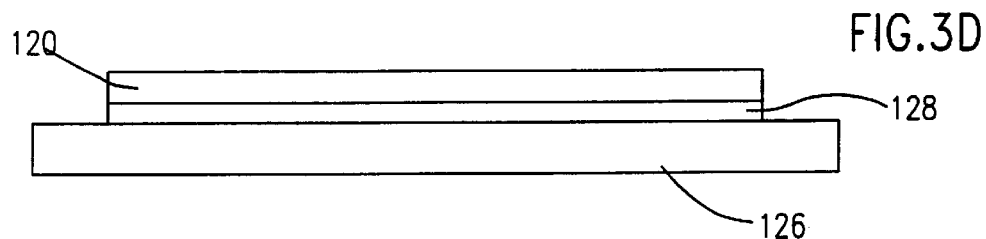

Following the bonding step described hereinabove, the silicon wafer 120 is preferably ground down to a decreased thickness, typically 100 microns, as shown in FIG. 3D. This reduction in wafer thickness is enabled by the additional mechanical strength provided by the bonding thereof of the insulating cover plate 126.

Following the reduction in thickness of the wafer, which is optional, the wafer is etched, using a photolithography process, along its back surface along predetermined dice lines which separate the individual dies. Etched channels 130 are thus produced, which extend entirely through the thickness of the silicon substrate, typically 100 microns. The etched wafer is shown in FIG. 3E.

Figure 3E:
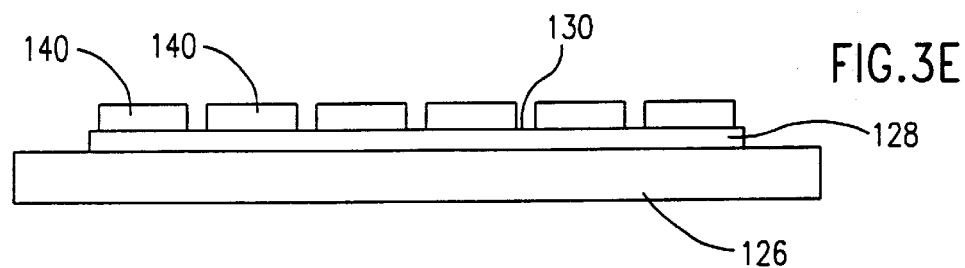

The aforementioned etching typically takes place in conventional silicon etching solution, such as a combination of 2.5% hydrofluoric acid, 50% nitric acid, 10% acetic acid and 37.5% water, so as to etch the silicon down to the field oxide layer, as shown in FIG. 3E.

The result of the silicon etching is a plurality of separated dies 140, each of which includes silicon of thickness about 100 microns.

Figure 3F:
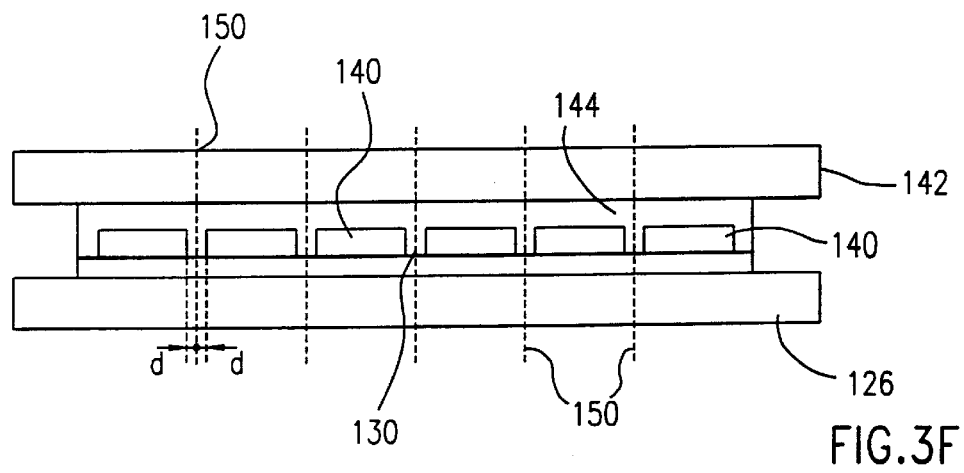

As seen in FIG. 3F, following the silicon etching, a second insulating packaging layer 142 is bonded over the dies 140 on the side thereof opposite to insulating packaging layer 126. A layer 144 of epoxy lies between the dies 140 and the layer 142 and epoxy also fills the interstices defined by etched channels 130 between dies 140. In certain applications, the packaging layer 142 and the epoxy layer 144 are both transparent.

The sandwich of the etched wafer 120 and the first and second insulating packaging layers 126 and 142 is then partially cut along lines 150, lying along the interstices between adjacent dies 140 to define notches along the outlines of a plurality of pre-packaged integrated circuits. It is noted that lines 150 are selected such that the edges of the dies along the notches are distanced from the outer extent of the silicon 140 by at least a distance d, as shown in FIG. 3F.

It is noted that partial cutting of the sandwich of FIG. 3F along lines 150 exposes edges of a multiplicity of pads on the silicon wafer 120, which pad edges, when so exposed, define contact surfaces on dies 140. These contact surfaces are in electrical contact with the contacts, such as contacts 12 or 16 shown in FIG. 1 and are designated in FIG. 1 by reference numerals 60 or 62 respectively.

It is a particular feature of the present invention that notches are formed in the sandwich of FIG. 3F in a grid pattern, wherein notches in a first direction are formed inwardly from a first planar surface of the sandwich and cut through the plane of the active surface of silicon substrate 120 and notches in a second direction, orthogonal to the first direction are formed inwardly from a second planar surface of the sandwich, parallel to the first planar surface and opposite thereto, and also cut through the plane of the active surface of silicon substrate 120.

Figure 4A:
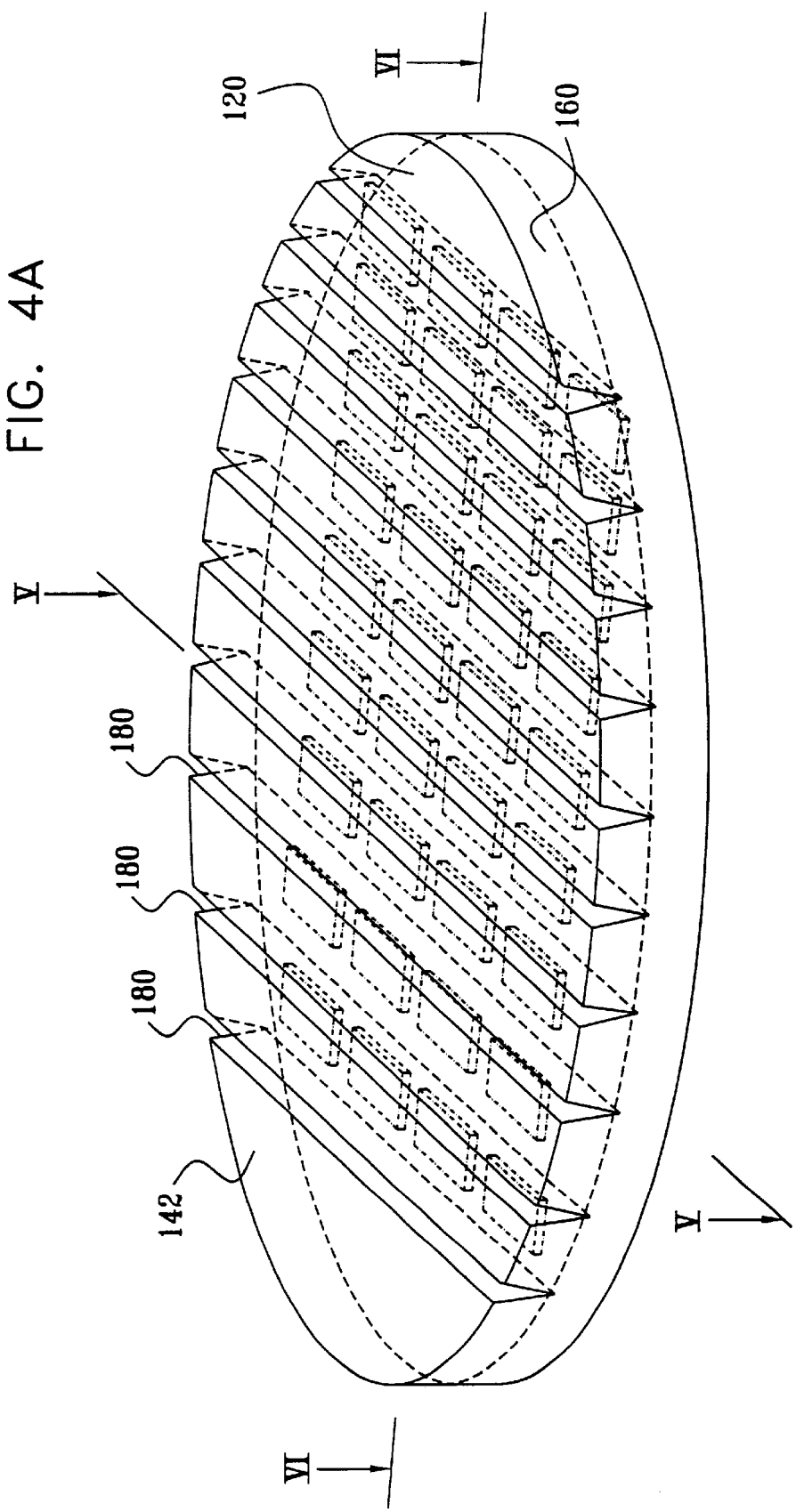
FIG. 4A is a simplified pictorial illustration of an in-production packaged wafer following the stage illustrated in FIG. 3F and following a first grooving stage.
Figure 4B:
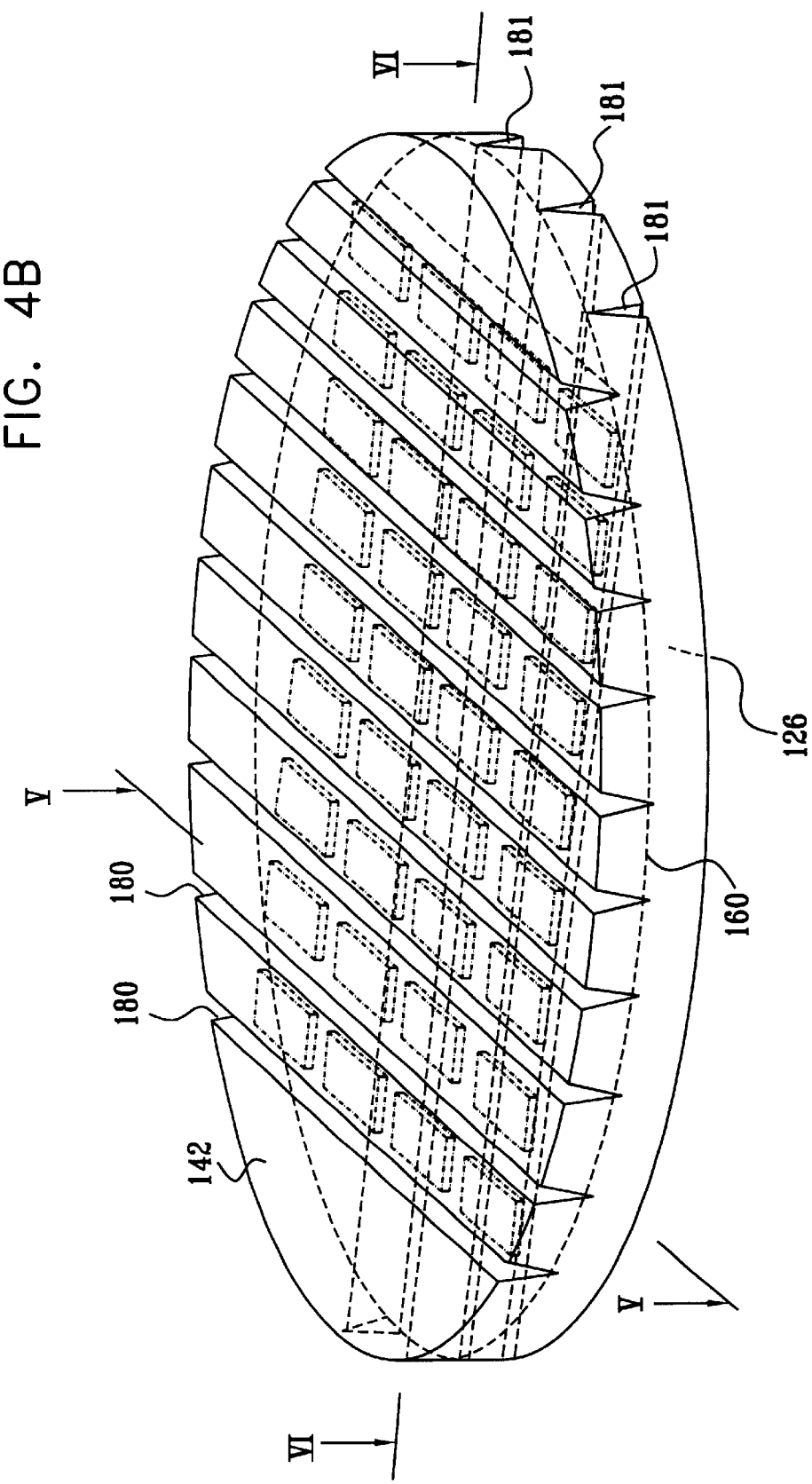
FIG. 4B is a simplified pictorial illustration of an in-production packaged wafer following the stages illustrated in FIGS. 3F and 4A and following a second grooving stage.

FIG. 4A illustrates notching of the sandwich of FIG. 3F, producing notches 180 which extend typically inwardly from substrate 142 and engaging the plane 160 of the active surface of silicon substrate 120. FIG. 4B illustrates notching of the sandwich of FIG. 4A, producing notches 181 inwardly from substrate 126. It is seen that the notches 181 of FIG. 4B extend perpendicularly to notches 180 of FIGS. 4A & 4B and that both notches 180 and 181 pass through plane 160.

Reference is now made to FIGS. 5A, 5B, 5C, 5D & 5E which are simplified sectional illustrations taken along lines VI—VI in FIG. 4B of a second series of stages in the production of chip-scale packaged integrated circuits in accordance with a preferred embodiment of the present invention.

FIG. 5A is a sectional illustration of the sandwich of FIG. 3F, which illustrates more clearly than in FIG. 3F, the dies 140 and the pads 172 extending outwardly thereof in the plane 160 (FIGS. 4A and 4B). The remaining structural elements shown in FIG. 3F are identified by the same reference numerals in FIG. 5A.

FIG. 5B shows the notches 180 illustrated in FIG. 4A.

Figure 5C:
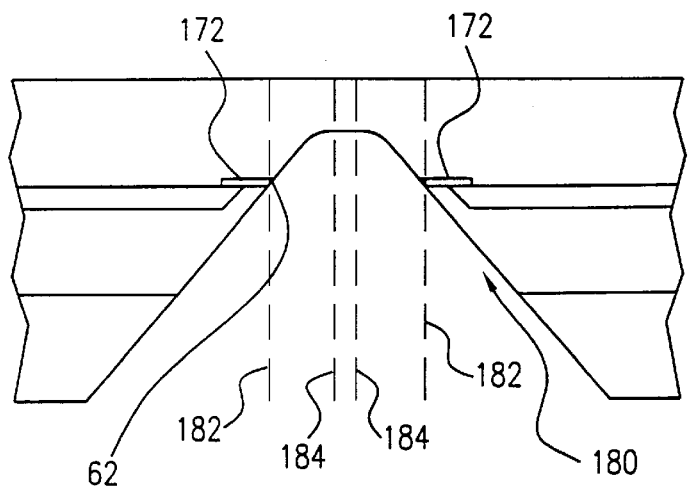

FIG. 5C illustrates a preferred cross sectional configuration of a notch 180 produced by partially cutting as described hereinabove in connection with FIG. 4A. Vertical lines 182 indicate the intersection of the notch 180 with the pads 172, defining exposed sectional pad surfaces 62 (FIG. 1). Vertical lines 184 indicate the location of a subsequent final cut which separates the dies into individual integrated circuits at a later stage.

Figure 5D:
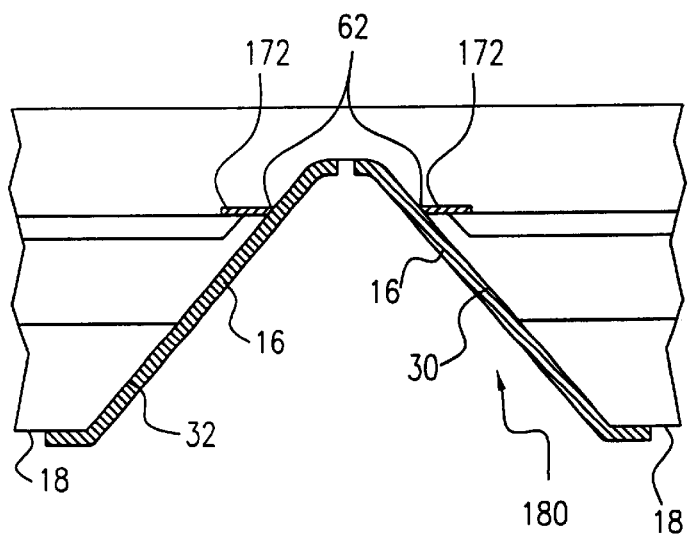

FIG. 5D illustrates the formation of metal contacts 16 (FIG. 1) along the edges 30 and 32 and part of the surface 18 (FIG. 1). These contacts, which may be formed by any suitable metal deposition technique, are seen to extend inside notch 180, thus establishing electrical contact with surfaces 62 of pads 172.

It is noted that metal contacts are formed onto the dies in electrical contact with surfaces 62 of pads 172 without first separating the dies into individual chips.

Figure 5E:
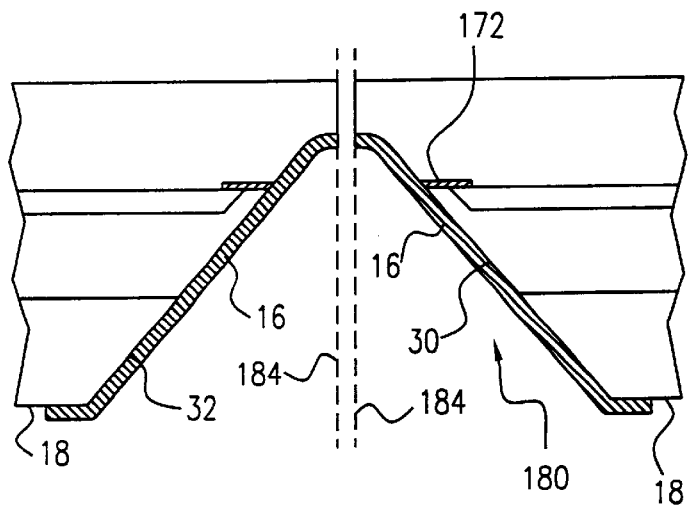

FIG. 5E illustrates subsequent dicing of the individual dies on the wafer, subsequent to metal contact formation thereon, into individual pre-packaged integrated circuit devices.

Reference is now made to FIGS. 6A, 6B, 6C, 6D and 6E, which are simplified sectional illustrations taken along lines V—V in FIG. 4B of the second series of stages in the production of chip-scale packaged integrated circuits in accordance with a preferred embodiment of the present invention.

FIG. 6A is a sectional illustration of the sandwich of FIG. 3F, which illustrates more clearly than in FIG. 3F, the dies 140 and the pads 272 extending outwardly thereof in the plane 160 (FIGS. 4A and 4B) in directions perpendicular to the directions along which extend pads 172. The remaining structural elements shown in FIG. 3F are identified by the same reference numerals in FIG. 6A.

FIG. 6B shows the notches 181 illustrated in FIG. 4B.

Figure 6C:
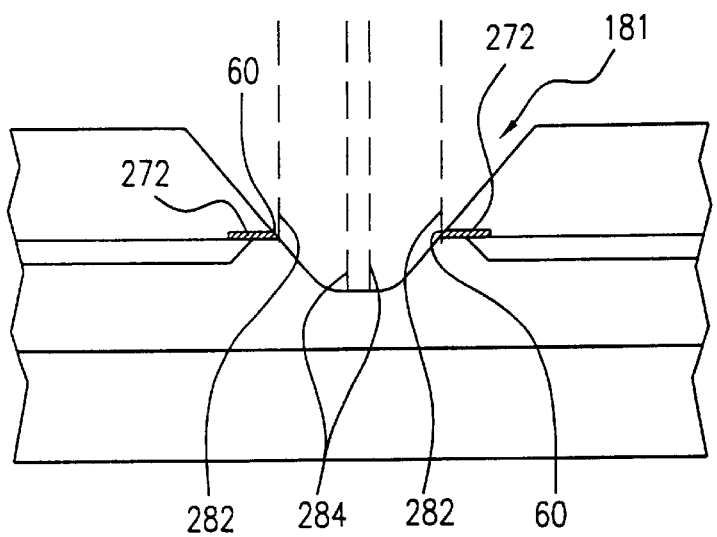

FIG. 6C illustrates a preferred cross sectional configuration of a notch 181 produced by partially cutting as described hereinabove in connection with FIG. 4B. Vertical lines 282 indicate the intersection of the notch 181 with the pads 272, defining exposed sectional pad surfaces 60 (FIG. 1). Vertical lines 284 indicate the location of a subsequent final cut which separates the dies into individual integrated circuits at a later stage.

Figure 6D:
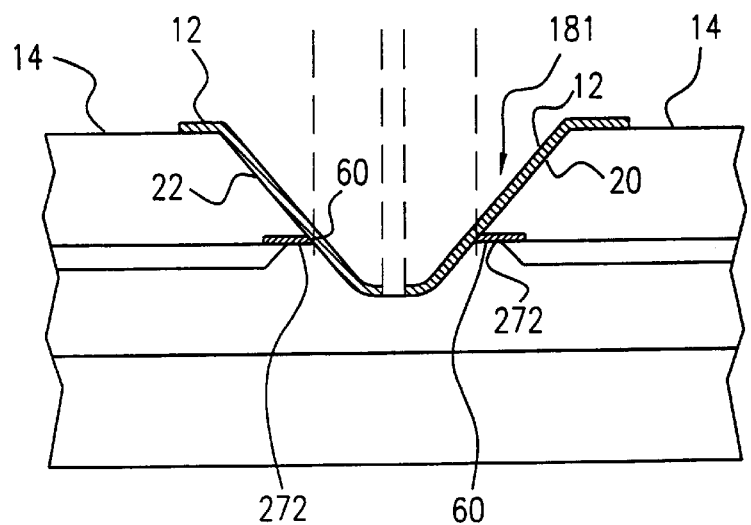

FIG. 6D illustrates the formation of metal contacts 12 (FIG. 1) along the edges 20 and 22 and part of the surface 14 (FIG. 1). These contacts, which may be formed by any suitable metal deposition technique, are seen to extend inside notch 181, thus establishing electrical contact with surfaces 60 of pads 272.

It is noted that metal contacts are formed onto the dies in electrical contact with surfaces 60 of pads 272 without first separating the dies into individual chips.

Figure 6E:
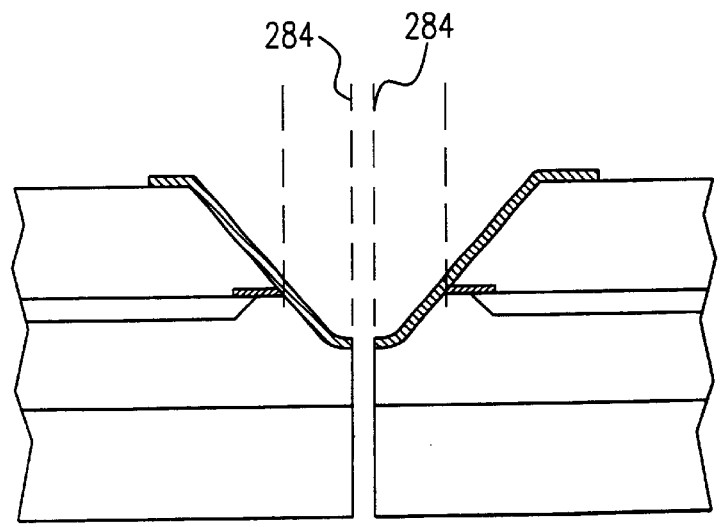

FIG. 6E illustrates subsequent dicing of the individual dies on the wafer, subsequent to metal contact formation thereon, into individual pre-packaged integrated circuit devices.

Figure 7A:
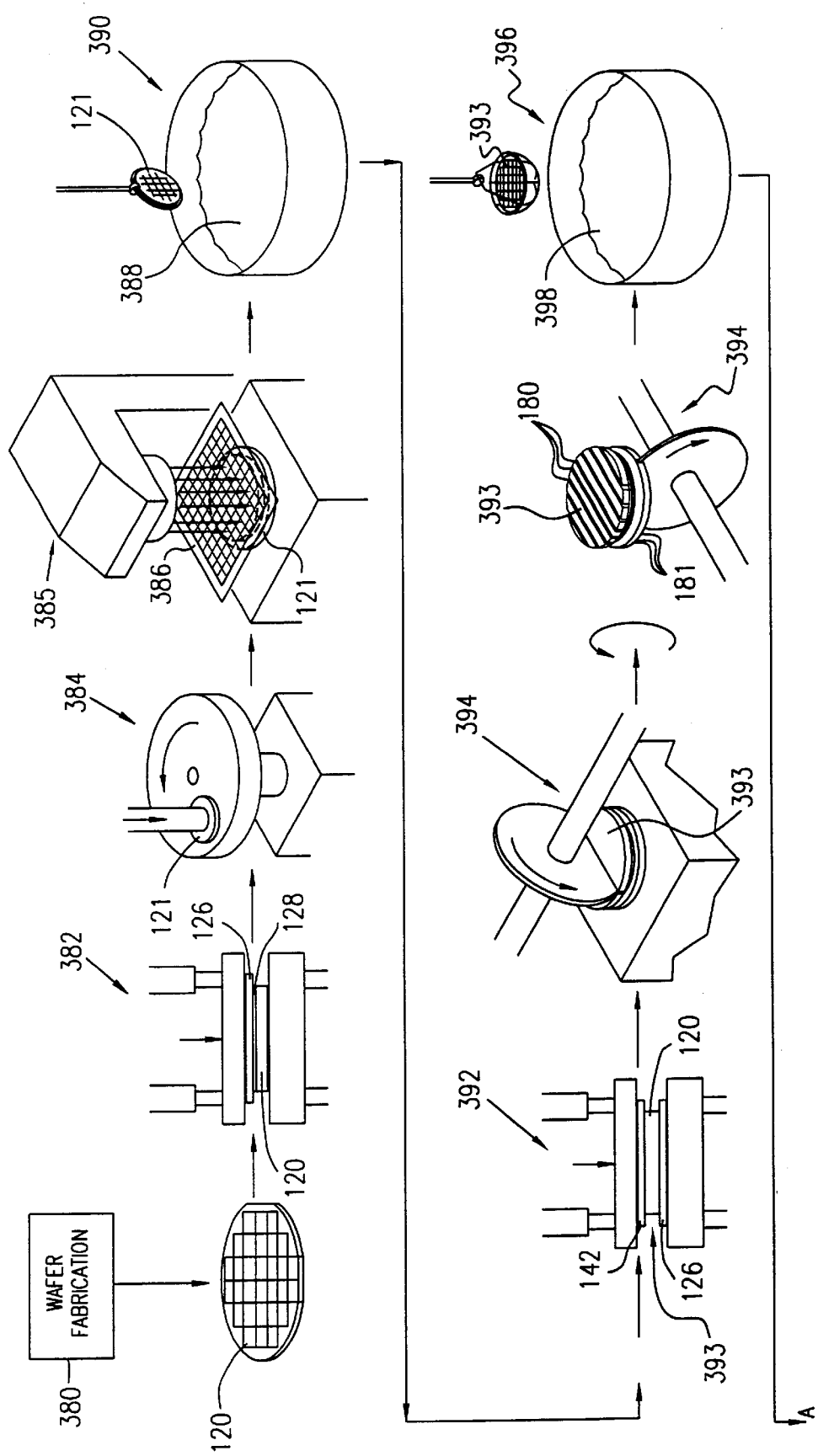
FIGS. 7A and 7B taken together illustrate apparatus and methodologies for producing integrated circuit devices in accordance with a preferred embodiment of the present invention.
Figure 7B:
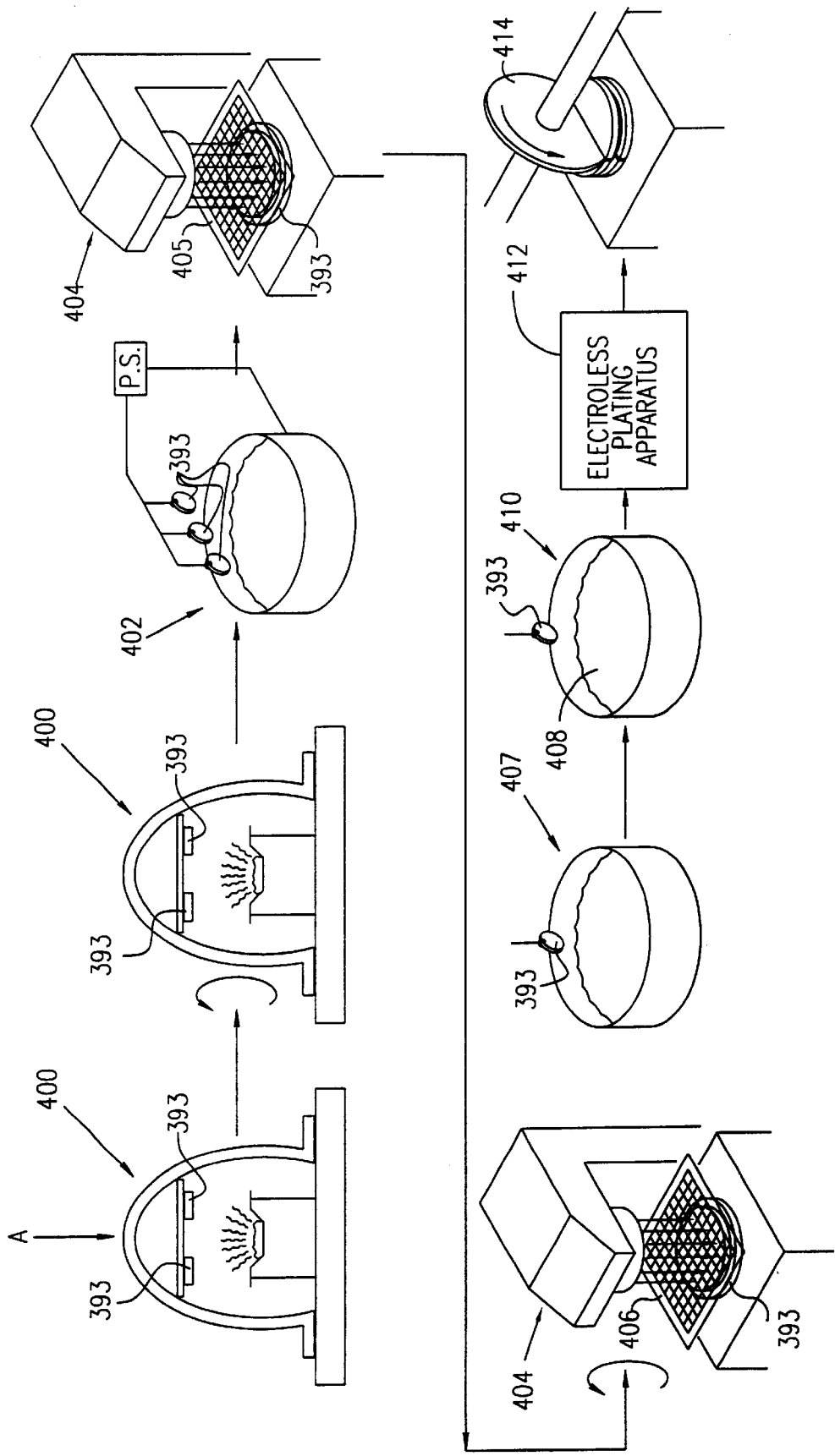

Reference is now made to FIGS. 7A and 7B, which together illustrate apparatus and methodologies for producing integrated circuit devices in accordance with a preferred embodiment of the present invention. A conventional wafer fabrication facility 380 provides complete wafers 120 (FIG. 3A). Individual wafers 120 are bonded on their active surfaces to protective layers, such as glass layers 126 (FIG. 3A), using epoxy 128 (FIG. 3C), by bonding apparatus 382, preferably having facilities for rotation of the wafer 120, the layer 126 and the epoxy 128 so as to obtain even distribution of the epoxy.

The bonded wafer 121 (FIG. 3C) is thinned at its non-active surface as by grinding apparatus 384, such as Model 32BTGW using 12.5A abrasive, which is commercially available from Speedfam Machines Co. Ltd. of England.

The wafer 121 is then etched at its non-active surface, preferably by photolithography, such as by using conventional spin-coated photoresist, which is commercially available from Hoechst, under the brand designation AZ 4562.

The photoresist is preferably mask exposed by a suitable UV exposure system 385, such as a Karl Suss Model KSMA6, through a lithography mask 386 to define etched channels 130 (FIG. 3E).

The photoresist is then developed in a development bath (not shown), baked and then etched in a silicon etch solution 388 located in a temperature controlled bath 390. Commercially available equipment for this purpose include a Chemkleen bath and an WHRV circulator both of which are manufactured by Wafab Inc. of the U.S.A. A suitable conventional silicon etching solution is Isoform Silicon etch, which is commercially available from Micro-Image Technology Ltd. of England. The wafer is conventionally rinsed after etching. The resulting etched wafer is shown in FIG. 3E.

Alternatively, the foregoing wet chemical etching step may be replaced by dry plasma etching.

The etched wafer is bonded on the non-active side to another protective layer 142 by bonding apparatus 392, which may be essentially the same as apparatus 382, to produce a doubly bonded wafer sandwich 393 as shown in FIG. 3F.

Notching apparatus 394 initially partially cuts the bonded wafer sandwich 393 of FIG. 3F inwardly from layer 142 to a configuration shown in FIG. 4A including notches 180 (FIG. 4A).

Notching apparatus 394 thereafter partially cuts the bonded wafer sandwich 393 of FIG. 3F inwardly from layer 126 to a configuration shown in FIG. 4B including notches 181 (FIG. 4B) and cuts the bonded wafer sandwich 393 of FIG. 3F inwardly from layer 142 a configuration shown in FIG. 4B including notches 180 (FIG. 4B), extending mutually non-collinear and normally mutually perpendicular to each other.

The notched wafer 393 is then subjected to anti-corrosion treatment in a bath 396, containing a chromating solution 398, such as described in any of the following U.S. Pat. Nos. 2,507,956; 2,851,385 and 2,796,370, the disclosure of which is hereby incorporated by reference.

Conductive layer deposition apparatus 400, which operates by vacuum deposition techniques, such as a Model 903M sputtering machine manufactured by Material Research Corporation of the U.S.A., is employed to produce a conductive layer initially on surfaces 30, 32 and 18 of each die of the wafer as shown in FIG. 1 and thereafter on surfaces 20, 22 and 14 of each die of the wafer as shown in FIG. 1.

Configuration of contact strips 12 and 16 as shown in FIG. 1, is carried out preferably by using conventional electro-deposited photoresist, which is commercially available from DuPont under the brand name Primecoat or from Shipley, under the brand name Eagle. The photoresist is applied to the wafers in a photoresist bath assembly 402 which is commercially available from DuPont or Shipley.

The photoresist is preferably light configured by a UV exposure system 404, which may be identical to system 385, using masks 405 and 406 to define suitable etching patterns. The photoresist is then developed in a development bath 407, and then etched in a metal etch solution 408 located in an etching bath 410, thus providing a conductor configuration such as that shown in FIG. 1.

The exposed conductive strips 12 and 16 shown in FIG. 1 are then plated, preferably by electroless plating apparatus 412, which is commercially available from Okuno of Japan.

The wafer is then diced into individual pre-packaged integrated circuit devices. Preferably the dicing blade 414 is a diamond resinoid blade of thickness 4–12 mils. The resulting dies appear as illustrated generally in FIG. 1.

It will be appreciated by persons skilled in the art that the present invention is not limited by what has been particularly shown and described hereinabove. Rather the scope of the present invention includes both combinations and sub-combinations of the various features described hereinabove as well as variations and modifications which would occur to persons skilled in the art upon reading the specification and which are not in the prior art.

What is claimed is:

1. A packaged integrated circuit comprising:
    an integrated circuit substrate lying in a substrate: plane and having electrical circuitry formed thereon;
    a package enclosing said integrated circuit substrate and defining first and second planar surfaces generally parallel to said substrate plane and at least one third surface disposed at an angle to said first and second planar surfaces; and
    a plurality of electrical contacts, each connected to said electrical circuitry at said substrate plane, at least some of said plurality of electrical contacts extending onto said first planar surface and at least some of said plurality of electrical contacts extending onto said second planar surface, at least one individual electrical contact from among said plurality of electrical contacts extending along at least a portion of said at least: one third surface.

2. A packaged integrated circuit according to claim 1 and wherein said package is a chip-scale package.

3. A packaged integrated circuit according to claim 1 and wherein said package includes at least one portion which is at least partially transparent to visible radiation.

4. A packaged integrated circuit according to claim 1 and wherein said package includes at least one portion which is at least partially transparent to infra-red radiation.

5. A packaged integrated circuit according to claim 2 and wherein said package includes at least one portion which is at least partially transparent to visible radiation.

6. A packaged integrated circuit according to claim 2 and wherein said package includes at least one portion which is at least partially transparent to infra-red radiation.

7. A packaged integrated circuit assembly comprising:
    a packaged integrated circuit including an integrated circuit substrate: lying in a substrate plane and having electrical circuitry formed thereon, a package enclosing said integrated circuit substrate and defining first and second planar Surfaces generally parallel to said substrate plane, at least one third surface disposed at an angle to said first; and second planar surfaces and a plurality of electrical contacts, each connected to said electrical circuitry at least some of said plurality of electrical contacts extending onto said first planar surface and at least some of said plurality of electrical contacts extending onto said second planar surface, at least one individual electrical contact from among said plurality of electrical contacts extending along at least a portion of said at least one third surface; and
    at least one additional electrical circuit element mounted onto and supported by said second planar surface and electrically coupled to at least one of said plurality of electrical contacts extending therealong.

8. A packaged integrated circuit assembly according to claim 7 and wherein said at least one additional electrical circuit element comprises an electrical component selected from the group consisting of: passive electrical elements, light generating elements, heat generating elements, light detecting elements, integrated circuits, hybrid circuits, environmental sensors, radiation sensors, micromechanical sensors, mechanical actuators and force sensors.

9. A packaged integrated circuit according to claim 7 and wherein said package is a chip-scale package.

10. A packaged integrated circuit according to claim 7 and wherein said package includes at least one portion which is at least partially transparent to visible radiation.

11. A packaged integrated circuit according to claim 7 and wherein said package includes at least one portion which is at least partially transparent to infra-red radiation.

12. A packaged integrated circuit according to claim 9 and wherein said package includes at least one portion which is at least partially transparent to visible radiation.

13. A packaged integrated circuit according to claim 9 and wherein said package includes at least one portion which is at least partially transparent to infra-red radiation.

14. A method for producing packaged integrated Circuits comprising:

producing, on a wafer scale, an integrated circuit substrate lying in a substrate plane and having electrical circuitry formed thereon;

providing wafer scale packaging enclosing said integrated circuit substrate and defining first and second planar surfaces generally parallel to said substrate plane and at least one third surface disposed at an angle to said first and second planar surfaces;

forming on said wafer scale packaging a plurality of electrical contacts, each connected to said electrical circuitry at said substrate plane, at least some of said plurality of electrical contacts extending onto said first planar surface and at least some of said plurality of electrical contacts extending onto said second planar surface, at least one individual electrical contact from among said plurality of electrical contacts extending along at least a portion of said at least one third surface; and separating said integrated circuit substrate in said wafer scale packaging into a plurality of individual chip pack-7gos.

15. A method for producing packaged integrated circuits according to claim 14 and wherein said plurality of individual chip packages are chip scale packages.

16. A method according to claim 14 and wherein said package includes at least one portion which is at least partially transparent to visible radiation.

17. A method according to claim 14 and wherein said package includes at least one portion which is at least partially transparent to infra-red radiation.

18. A method according to claim 15 and wherein said package includes at least one portion which is at least partially transparent to visible radiation.

19. A method according to claim 15 and wherein said package includes at least one portion which is at least partially transparent to infra-red radiation.

20. A method for producing packaged integrated circuit assemblies, the method comprising:

producing, on a wafer scale, an integrated circuit substrate lying in a substrata plane and having electrical circuitry formed thereon;

providing wafer scale packaging enclosing said integrated circuit substrate and defining first and second planar surfaces generally parallel to said substrate plane and at least one third surface disposed at an angle to said first and second planar surfaces;

forming on said wafer scale packaging a plurality of electrical contacts, each connected to said electrical circuitry, at leapt some of said plurality of electrical contacts extending onto said: First planar surface and at least some of said plurality of electrical contacts extending onto said second planar surface, at least one individual electrical contact from among said plurality of electrical contacts extending along at least a portion of said at least one third surface;

separating said integrated circuit substrate in said wafer scale packaging into a plurality of individual chap packages; and subsequently mounting onto said at second planar surface of at least one of said plurality of individual chip packages, at least one additional electrical circuit element, said at least one additional electrical circuit element being supported key said second planar surface and electrically coupled to at least: one of said plurality of electrical contacts extending therealong.

21. A method of forming a packaged integrated circuit assembly according to claim 20 and wherein said at least one additional electrical circuit element comprises an electrical component selected from the group consisting of: passive electrical elements, light generating elements, heat generating elements, light detecting elements, integrated circuits, hybrid circuits, environmental sensors, radiation sensors, micromechanical sensors, mechanical actuators and force sensors.

22. A method for producing packaged integrated circuits according to claim 20 and wherein said plurality of individual chip packages are chip scale packages.

23. A packaged integrated circuit according to claim 20 and wherein said package includes at least one portion which is at least partially transparent to visible radiation.

24. A packaged integrated circuit according to claim 20 and wherein said package includes at least one portion which is at least partially transparent to infra-red radiation.

25. A packaged integrated circuit according to claim 22 and wherein said package includes at least one portion which is at least partially transparent to visible radiation.

26. A packaged integrated circuit according to claim 22 and wherein said package includes at least one portion which is at least partially transparent to infra-red radiation.

27. A method for producing packaged integrated circuit: assemblies, the method comprising:

producing, on a wafer scale, an integrated circuit substrate lying in a substrate plane and having electrical circuitry formed thereon;

providing wafer scale packaging enclosing said integrated circuit substrate and defining first and second planar surfaces generally parallel to said substrate plane and at least one third surface disposed at an angle to said first and second planar surface;

forming on said wafer scale packaging a plurality of electrical contacts, each connected to said electrical circuitry, at least some of said plurality of electrical contacts extending onto said first planar surface and at least some of said plurality of electrical contacts extending onto said second planar surface, at least one individual electrical contact from among said plurality of electrical contacts extending along at least a portion of said at least one third surface;

mounting onto said at second planar surface of said wafer scale packaging, at least one additional electrical circuit element, said at least one additional electrical circuit element being supported by said second planar surface and electrically coupled to at least one of said plurality of electrical contacts extending therealong; and subsequently separating said integrated circuit substrate in said wafer scale packaging into a plurality of individual, chip packages.

28. A method of forming a packaged integrated circuit assembly according to claim 27 and wherein said at least one additional electrical circuit element comprises an electrical component selected from the group consisting of: passive electrical elements, light generating elements, heat generating elements, light detecting elements, integrated circuits, hybrid circuits, environmental sensors, radiation sensors, micromechanical sensors, mechanical actuators and force sensors.

29. A method for producing packaged integrated circuits according to claim 27 and wherein said plurality of individual chip packages are chip scale packages.

30. A packaged integrated circuit according to claim 27 and wherein said package includes at least one portion which is at least partially transparent to visible radiation.

31. A packaged integrated circuit according to claim 27 and wherein said package includes at least one portion which is at least partially transparent to infra-red radiation.

32. A packaged integrated circuit according to claim 29 and wherein said package includes at least one portion which is at least partially transparent to visible radiation.

33. A packaged integrated circuit according to claim 29 and wherein said package includes at least one portion which is at least partially transparent to infra-red radiation.

34. A packaged circuit according to claim 1 wherein at least one of said electrical contacts extending onto said first planar surface extends along said at least one third surface.

35. A packaged circuit according to claim 34 wherein at least one of said electrical contacts extending onto said second planar surface extends along said at least one third surface.

36. A packaged circuit according to claim 1 wherein at least one individual electrical contacts from among said plurality of electrical contacts which is connected to said electrical circuitry defines a location of contact between said individual electrical contact and said electrical circuitry and wherein said location of contact is located on said at least one third surface of the package.

37. A packaged circuit according to claim 1 wherein at least a majority of the contacts extend along said at least one third surface.

38. A packaged circuit according to claim 1 wherein substantially all of the contacts extend along said at least one third surface.

* * * * *